United States Patent [19]

Fennessy et al.

[11] 4,109,373
[45] Aug. 29, 1978

[54] METHOD FOR MANUFACTURING SEMICONDUCTOR DEVICES

[75] Inventors: Donald W. Fennessy, Liverpool; Harry W. Schmitz, Glens Falls, both of N.Y.

[73] Assignee: General Electric Company, Auburn, N.Y.

[21] Appl. No.: 691,241

[22] Filed: Jun. 1, 1976

Related U.S. Application Data

[60] Continuation of Ser. No. 556,824, Mar. 10, 1975, abandoned, which is a division of Ser. No. 449,550, Mar. 8, 1974, Pat. No. 3,941,532.

[51] Int. Cl.² .................. B29C 6/00; H01L 21/58; H01L 21/60
[52] U.S. Cl. ............................ 29/588; 29/576 S; 264/272
[58] Field of Search .............. 264/272, 278; 29/588, 29/576 S; 425/DIG. 34

[56] References Cited

U.S. PATENT DOCUMENTS

| | | | |
|---|---|---|---|
| 2,492,415 | 12/1949 | Coates et al. | 425/123 |
| 3,439,238 | 4/1969 | Birchler et al. | 29/588 |
| 3,571,920 | 3/1971 | Berg | 264/272 |
| 3,618,199 | 11/1971 | King et al. | 29/588 |

Primary Examiner—James B. Lowe
Attorney, Agent, or Firm—R. J. Mooney; S. B. Salai

[57] ABSTRACT

Disclosed is a method for fabricating semiconductor devices and apparatus that can be used in the practice thereof. A plurality of sets of lead wires is mounted on a reusable primary lead frame. While the lead frame, and thus the lead wires are supported, a pellet is attached to one wire of each of the sets and appropriate flying leads are bonded in place. The sets of lead wires are then transferred to a reusable segmented lead frame, that includes a plurality of elements which are resiliently mounted with respect to each other. Each element supports one set of lead wires. A plurality of cup-shaped mold cavities defined by the mold are filled with a curable fluid encapsulant. The mold is adapted to cooperate with the segmented lead frame as hereinafter set forth. The ends of the lead wires supporting the pellets are immersed in the encapsulant. Alignment pins on the segmented lead frame mate with the alignment openings in the mold, thus insuring proper alignment of the sets of lead wires and the cup-shaped mold cavities.

3 Claims, 25 Drawing Figures

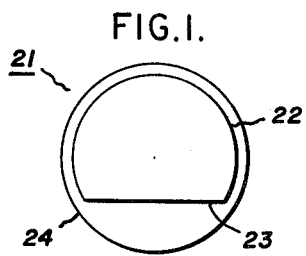
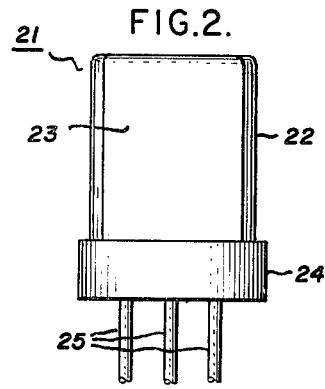
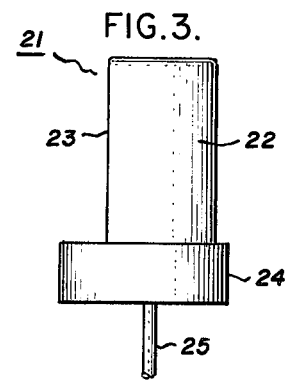
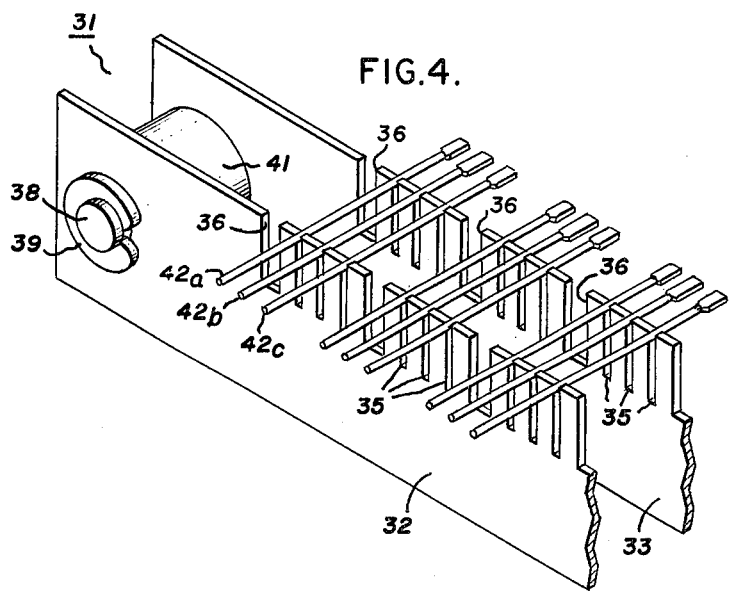
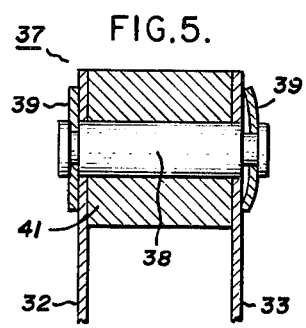
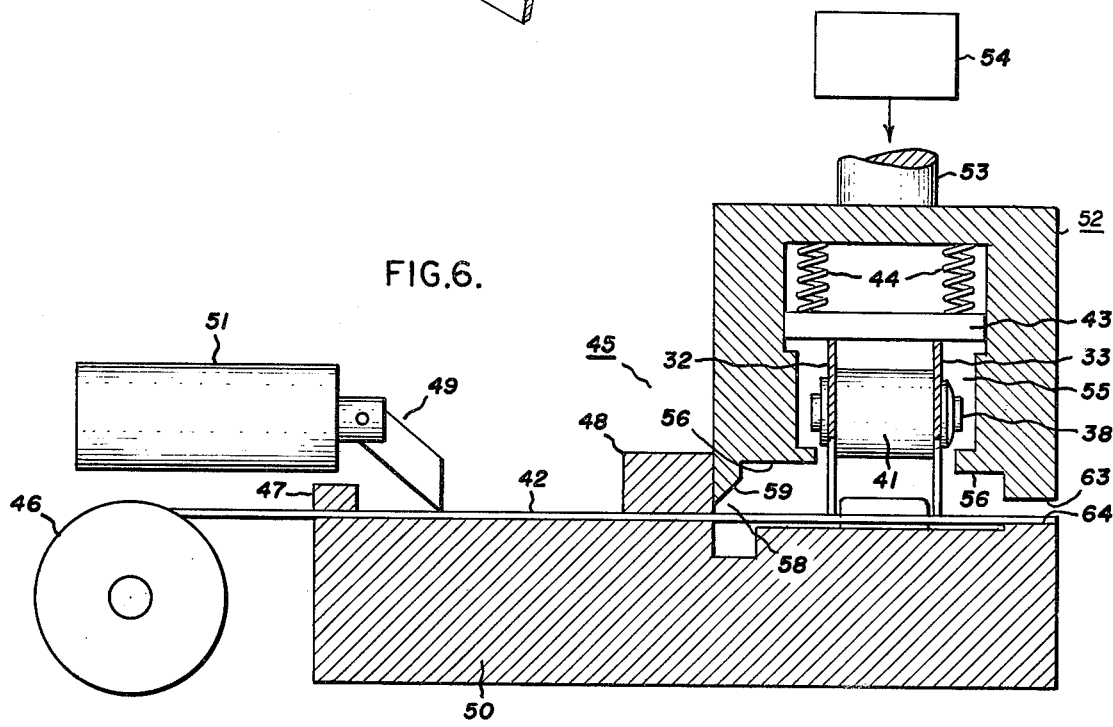

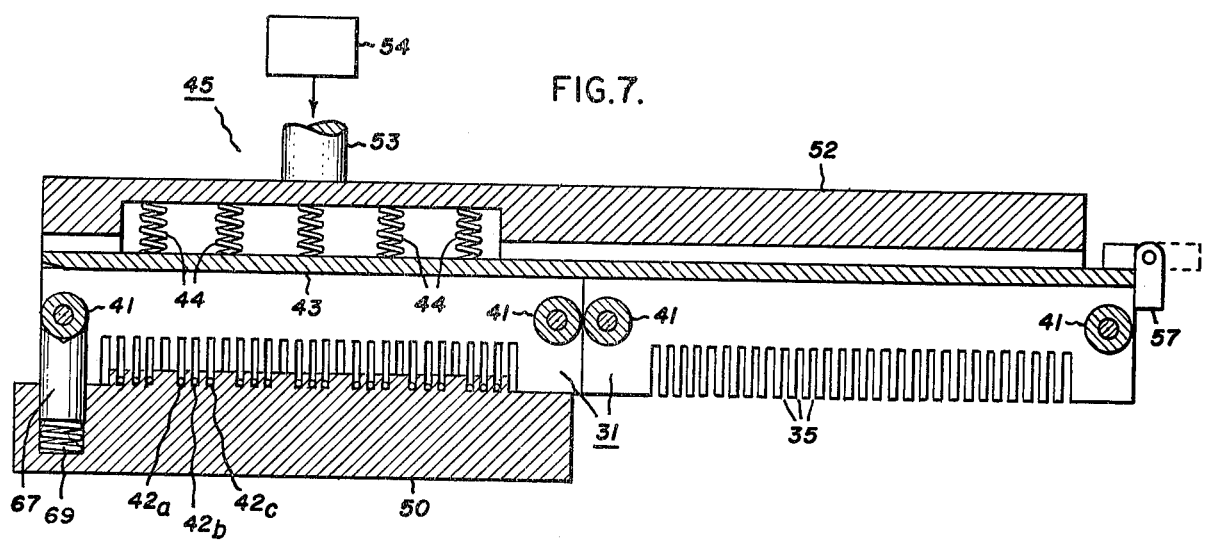
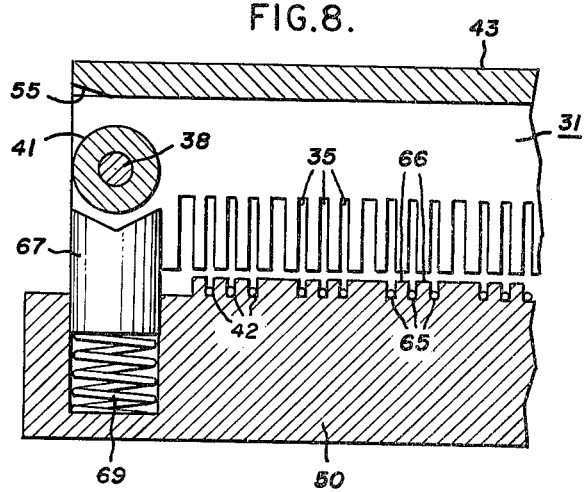
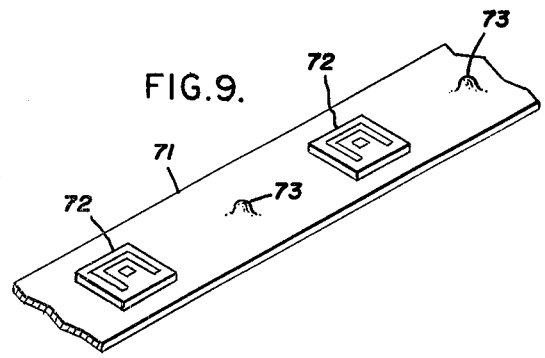
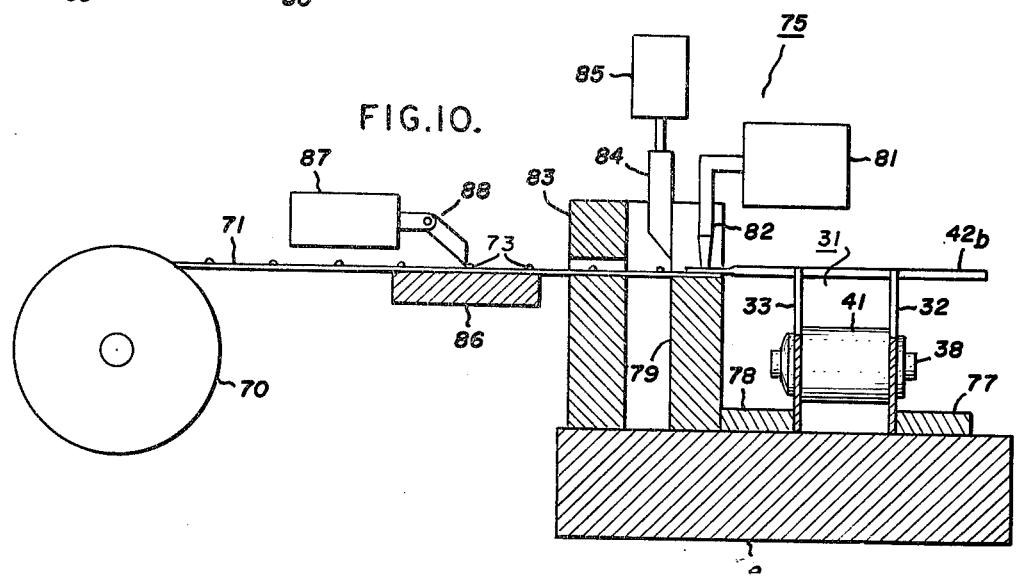

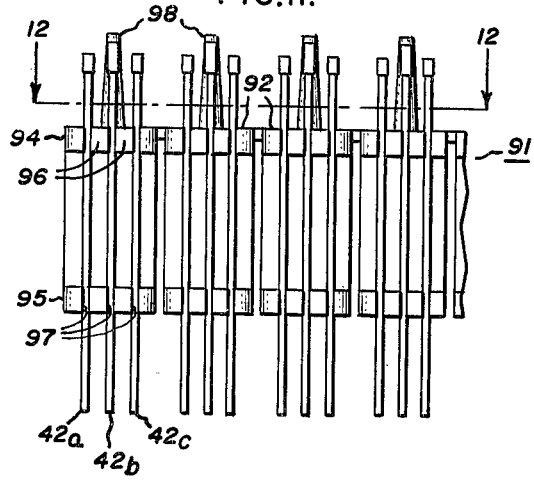
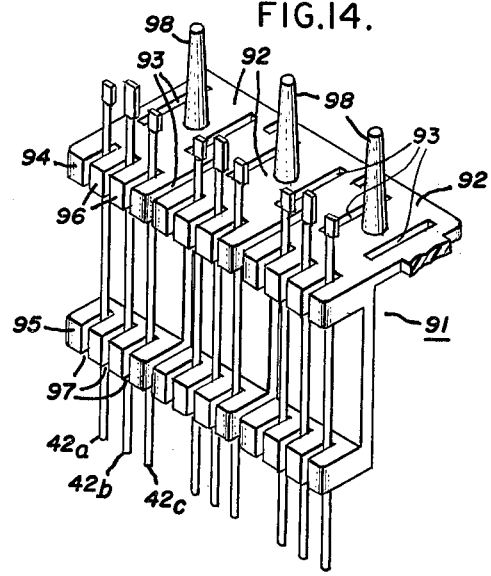
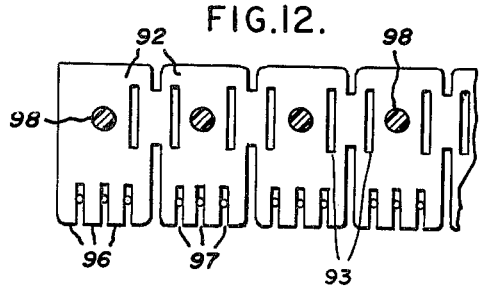
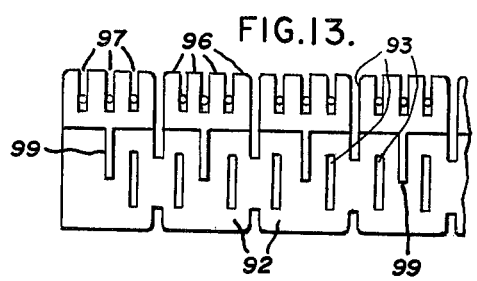
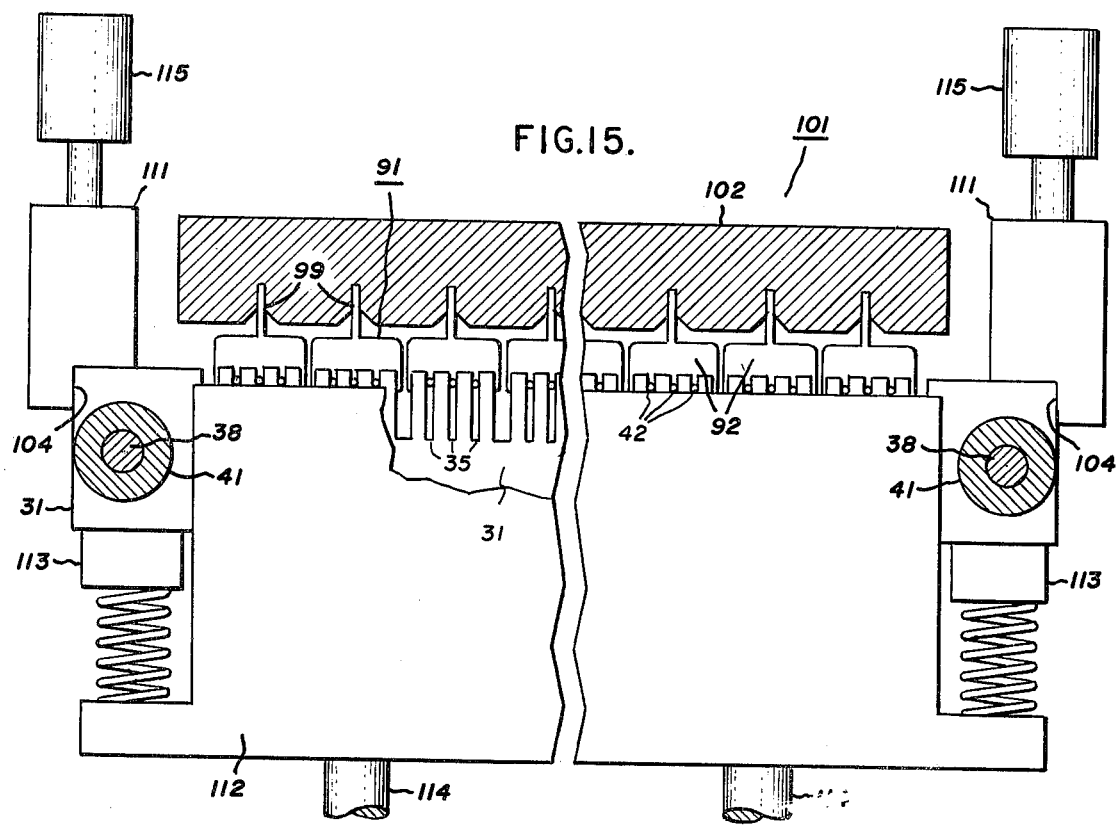

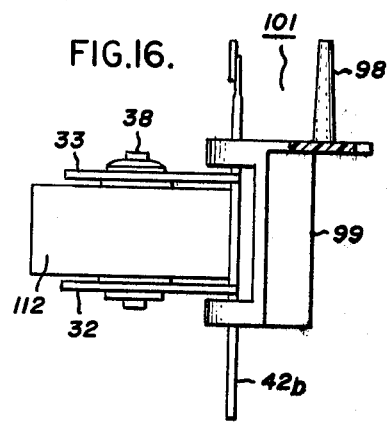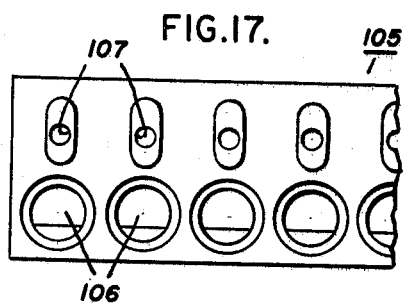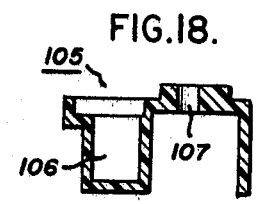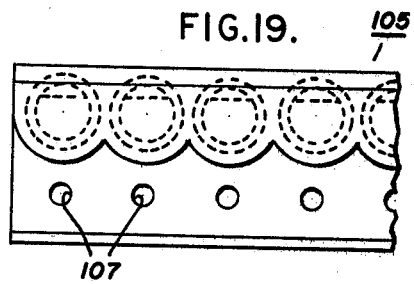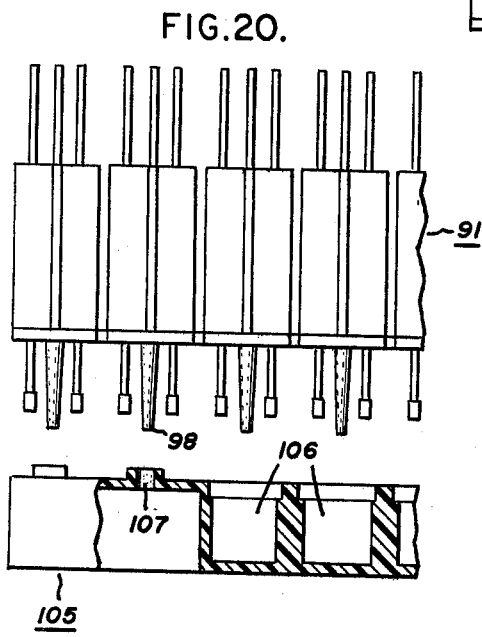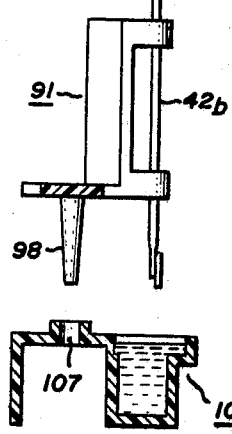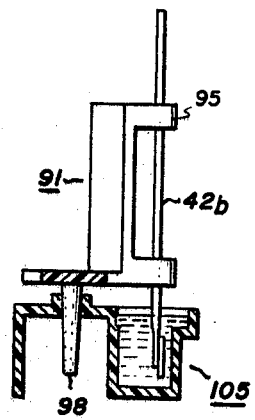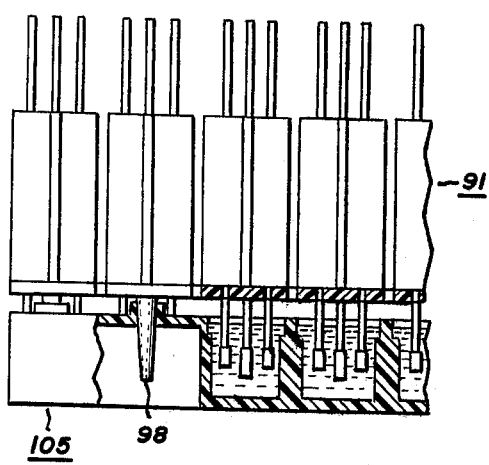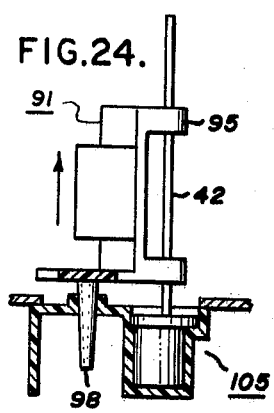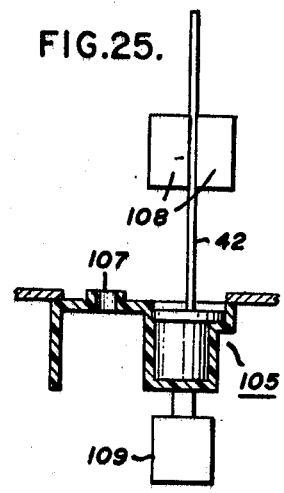

METHOD FOR MANUFACTURING SEMICONDUCTOR DEVICES

Cross references to related applications. This is a continuation of U.S. patent application Ser. No. 556,824 filed Mar. 10, 1975, now abandoned, which is a division of Ser. No. 449,550 filed Mar. 8, 1974, now U.S. Pat. No. 3,941,532.

BACKGROUND OF THE INVENTION

This invention relates to semiconductor device manufacture and, more particularly, to a method for supporting lead wire sets during the pellet mount and encapsulation steps of plastic encapsulated semiconductor device manufacture.

Semiconductor devices generally require environmental protection. To insure reliable operation, protection must be provided against the effects of, for example, mechanical abuse, water and water vapor, solvents, oils, greases and acids. Of course, it is rare that a single semiconductor device is exposed to, and thus requires protection from, all of the aforementioned hazards. Nevertheless, it is economically desirable to provide protection against most or all common potential hazards while utilizing only a single packaging approach. In this way mass production is facilitated and costs are reduced.

Plastic encapsulation has been found to be an effective way of physically and electrically protecting semiconductor devices at a relatively low cost. Plastic encapsulation has the further advantage of providing physical support for the several component parts forming the semiconductor device thus allowing the header assembly, which conventionally provides mechanical support, to be eliminated. However, the potential advantages of plastic encapsulation have not heretofore been fully realized as consideration of the following examples will indicate.

One method of manufacturing plastic encapsulated semiconductor devices begins with the step of punching a strip of copper to partially define leads. Thus, in the manufacture of transistors the copper strip is punched so that portions of three leads are formed. A sufficient portion of the copper strip is left intact to maintain the integrity of the strip and subsequent manufacturing processes are preferably performed in a batch process or mass production manner. After semiconductor pellets are affixed to the sets of three leads and electrical connections are provided, the portion of each device around the pellet is encapsulated. Typically, the portion of the copper farthest from the pellets supports the leads during the aforementioned steps. Following encapsulation that portion is removed thus separating the individual transistors and the leads from the strip. Often the leads thus formed are subjected to a rounding operation to remove the corners that are formed by the punching of the copper strip. The disadvantages of this system include the high number of steps required and the substantial amount of material wasted. Waste occurs because only a small portion of the original copper strip ultimately serves as part of finished devices. The remaining portion of the strip is waste material.

Another method of manufacturing plastic encapsulated transistors utilizes sets of lead wires that pass through small plastic beads and are thus coupled together. During fabrication, the sets of wires are individually handled as pellets and flying leads are affixed thereto. Ultimately, several sets of wires are placed in a rack that cooperates with a mold to facilitate plastic encapsulation. Following the encapsulation step, the plastic beads must be removed from the leads and discarded. The primary disadvantages of the system outlined immediately above include the waste of the the bead material which at least partially offsets the cost saving realized from the elimination of the header. Furthermore, handling is complex and requires many steps inasmuch as each bead and set of wires is handled individually for most of the fabrication operations.

It is, therefore, an object of this invention to provide a method for manufacturing plastic encapsulated semiconductor devices at a low cost, with a minimum number of steps and with a minimum waste of material.

SUMMARY OF THE INVENTION

This invention is characterized by a method for manufacturing plastic encapsulated semiconductors and by apparatus suitable for the practice thereof. In accordance with the subject invention there is provided a segmented reusable lead frame that includes a plurality of elements in a linear array. The elements are resiliently connected such that the spacing therebetween can vary. Each element includes a face from which two substantially parallel rows of tabs project. The tabs define two substantially parallel rows of lead wire retaining slots. Also provided in accordance with the subject invention is a mold that defines a linear array of cup-shaped mold cavities. The cavities are spaced to permit approximate alignment with wire leads held in the lead retaining slots.

Projecting from each element of the segmented lead frame is an alignment pin. A plurality of alignment openings is defined by the mold, with one opening adjacent each cup-shaped mold cavity. Inasmuch as each element includes a pin, each mold cavity is associated with an alignment opening and the spacing among the element is variable, insertion of the alignment pins in the alignment openings provides accurate alignment of lead wires clamped in the lead wire retaining slots and the cup-shaped mold cavities. Thus it will be appreciated that by properly selecting the lead wire length, accurate positioning of one end of the lead wires in the cup-shaped cavities can be assured. Consequently, if a semiconductor device is fabricated on the ends of the lead wires, accurate encapsulation of the device is greatly simplified by the cooperation of the segmented lead frame and the mold.

Also provided in accordance with the invention is a primary reusable lead frame comprising two generally parallel elongated members that are spatially separated and define a plurality of lead retaining slots which are spaced substantially identically with the lead retaining slots in the segmented lead frame. The separation of the elongated members is slightly less than the separation of the parallel rows of projections on the segmented lead frame. As a result of this and other features the elongated members can partially slide between the projections on the segmented lead frame and facilitate transfer of sets of lead wires from one lead frame to the other lead frame as hereinafter described. This is considered advantageous inasmuch as the primary lead frame is particularly adapted for retaining sets of lead wires during such steps as pellet mount and ball bonding, while the segmented lead frame is particularly adapted for retaining sets of lead wires during an encapsulation process. The particular features resulting in the aforementioned adaptations will become apparent below.

During practice of the preferred method a plurality of sets of lead wires is mounted in the resuable primary lead frame. While the lead frame, and thus the lead wires are supported, a pellet is attached to one wire of each of the sets and appropriate flying leads are bonded in place. The sets of lead wires are then transferred to the reusable segmented lead frame, with each element supporting one set of lead wires. The cup-shaped mold cavities defined by the mold are filled with a curable fluid encapsulant. The ends of the lead wires supporting the pellets are immersed in the encapsulant. The alignment pins on the segmented lead frame made with the alignment openings in the mold, thus insuring proper alignment of the sets of lead wires and the cup-shaped mold cavities.

It should be stressed that the mold and both of the lead frames are reusable. Thus, there is no material waste comparable to the waste of the excess portions of the copper strip discussed above. Therefore costs are kept at a minimum. Furthermore, as will be apparent below, both the lead frames and the mold particularly lend themselves to automated manufacture thus further reducing device cost.

DESCRIPTION OF THE DRAWINGS

These and other features and objects of the present invention will become more apparent upon a perusal of the following description taken in conjunction with the accompanying drawings wherein:

FIGS. 1–3 illustrate a plastic encapsulated transistor as is manufactured in accordance with the subject invention;

FIG. 4 is an isometric view of a portion of a primary reusable lead frame with several sets of lead wires therein;

FIG. 5 is a sectional plan view of the lead frame depicted in FIG. 4;

FIG. 6 is a sectional diagramatic elevation view of apparatus utilized to insert lead wires into the lead frame depicted in FIGS. 4 and 5;

FIG. 7 is a front sectional view of the apparatus shown in FIG. 6;

FIG. 8 is a detail of a portion of FIG. 7;

FIG. 9 is an isometric view of a portion of KOVAR strip with semiconductor pellets mounted thereon;

FIG. 10 is an elevation view of an apparatus utilized to bond portions of the KOVAR strip to lead wires in the primary lead frame;

FIGS. 11–14 illustrate a resilient segmented lead frame for supporting lead wires during certain processing steps;

FIGS. 15 and 16 illustrate a method for transferring lead wires from the primary lead frame to the resilient segmented lead frame;

FIGS. 17–19 illustrate a resilient plastic mold used for encapsulating devices manufactured in accordance with the subject method; and FIGS. 20–25 illustrate the encapsulation process.

DESCRIPTION OF THE PREFERRED EMBODIMENTS

Referring first to FIGS. 1–3 there is shown a transistor 21 of the type that can conveniently be manufactured utilizing the subject method. A molded plastic body consists essentially of an upper cylindrical portion 22 with a flattened side 23. At the base of the transistor 21 is a circular flange 24. Three lead wires 25 project from the bottom of the circular flange. As an example, fabrication of transistor 21 will be described below.

Referring now to FIGS. 4 and 5 there is shown a primary reusable metallic lead frame 31 consisting essentially of two spatially separated, generally parallel, elongated metallic members 32 and 33. The metallic members are made of a resilient metal such as phosphor bronze and are separated by a predetermined distance and each defines a plurality of sets of wire retaining slots 35. When phosphor bronze is used, the members can simply be stamped from metal strips. The sets of slots 35 are separated by slightly wider separating slots 36. The lead frame 31 comprises several sets of slots. For example, for the apparatus and method to be described, it has been found that 25 sets of slots (75 slots) can conveniently be included on one lead frame. Thus, a preferred lead frame comprises 25 sets of slots 35 shown in FIG. 4. The opposite, unshown, end of the lead frame 31 is simply a mirror image of the end shown in FIG. 4.

Connecting the two members 32 and 33 on each end of the lead frame 31 is an indexing connector assembly 37. The indexing connector assembly 37 is shown most clearly in FIG. 5. A pin 38 passes through openings in each of the members 32 and 33. Grooves cut near each end of the pin 38 receive retaining "C" rings 39. To assure proper separation of the members 32 and 33, the pin 38 passes through an outer indexing sleeve 41. The length of the sleeve corresponds to the desired separation between the members 32 and 33. Preferably, one of the rings 39 is dished as shown in FIG. 5 to provide a spring effect. It will, of course, be appreciated that the sleeve 41 and pin 38 may be a single body of material.

It is preferable to choose a sleeve size such that the periphery of the sleeve 41 is tangent to the end of the elongated members 32 and 33 as is shown in FIG. 5. This is so because the end of the lead frame 31 is used for indexing as will hereinafter be described. Tangency provides a greater end surface area for indexing.

As shown in FIG. 4, each of the sets of wire retaining slots 35 receives a set of lead wires 42 a,b,c. It will be noticed that each wire has one flattened end which facilitates steps such as ball bonding and pellet mounting. The metallic members 32 and 33 are slightly resilient to facilitate the insertion of the wires 42a–c in the slots 35. Furthermore, the separator slots 36 insure that room is provided for adequate lateral motion of the fingers defining the slots.

Referring now to FIGS. 6 and 7 there is shown a wire loading apparatus 45 for loading the lead wires 42a–c into the lead wire retaining slots 35. A roll 46 of wire 42 is passed through two straightening and guiding apertures 47 and 48 toward a loading point over a base member 50. Between the apertures is a flat bed portion where the wire 42 is exposed. A wire feed system, diagrammatically illustrated as a pawl 49 on a solenoid 51, rests on the wire 42 on the flat bed portion. When the solenoid 51 is activated the pawl 49 moves to the right and carries therewith the wire 42. Upon deactivation of the solenoid 51, the pawl 49 moves to the left but the wire remains stationary. It should be appreciated that the roll 46 is just one of 75 rolls of wire 42, because a separate wire is supplied to each of the 75 lead wire retaining slots 35. Commercially available devices for sequentially advancing many parallel wires include wire feeders sold under the name RAPIDAIR by Machine Tools and Engineering Company of Rockford, Illinois. The solenoid 51 and pawl 49 can, of course, be replaced by such devices.

Shown in FIG. 7 is an elongated member 52 that is vertically movable by a shaft 53 and a ram 54. As best seen in FIG. 6, the member 52 defines a channel 55 that is partially bounded by two shoulders 56 that interact with the ends of the pins 38 such that primary lead frames 31 are slideably retained in the channel as shown. The upper wall of the channel 55 is defined by a vertically slideable platen 43 that is urged against the upper portion of the elongated members 32 and 33 by springs 44 (only two of which are shown). A plurality of springs 44 is included to insure that the platen 43 remains substantially parallel to the base member 50 and does not jam during vertical sliding motion while inserting and removing lead frames 31.

As shown most clearly in FIG. 7, the elongated member 52 is approximately the length of two lead frames 31 butted end to end. On the right end is a hinged, selectively releasable latch 57 which, when in the position shown in FIG. 7, prevents lead frames 31 from sliding out of the right end of the member 52. However, when the latch 57 is rotated to the position shown in phantom in FIG. 7, the lead frames 31 freely slide out of the right end of the member 52. Control over the latch member 57 can be by any conventionally available system.

It will be observed from FIG. 8 that the channel 55 is slightly flared on the left end to facilitate insertion of primary lead frames 31.

Referring now to FIG. 6 it is seen that the wire 42, upon passing out of the aperture 48, passes a cutting station 58 where a cutting blade portion 59 on the member 52 will cut the wire during downward vertical motion of the member 52. The end of the wire rests between two flattening dies 63 and 64. Observation of FIG. 8 shows that the 75 wires 42 pass through a plurality of slots 65 that are defined by a plurality of ribs 66. Furthermore, it will be appreciated that the slots 65 align with the wire retaining slots 35 in a lead frame 31 when the frame is properly positioned.

Approximate lead frame positioning is provided by utilizing two lead frames 31 in the member 52. When the right lead frame (FIG. 7) is urged against the latch 57 and the left lead frame is abutted against the end of the right lead frame, approximate alignment is provided.

More precise alignment is provided by a positioning cylinder 67 with a notched upper surface. The cylinder is loaded by a spring 69. As is shown most clearly in FIG. 8, when the apparatus supports the lead frame 31 in its upper position the indexing sleeve 41 is separated from the cylinder 67 and thus the lead frames 31 can slide in the elongated member 52. However, upon activation of the ram 54 and subsequent lowering of the elongated member 52, the sleeve 41 engages the cylinder 67 (FIG. 7) and provides a precise alignment between the lead retaining slots 35 and the slots 65. When the sleeve 41 is fully engaged in the V shaped top of the cylinder 67, further downward motion of the lead frame 31 is compensated for by the spring 69.

It will be appreciated that utilization of a rigid lead frame permits all the slots 35 to be properly positioned by indexing only the sleeve 41 or the end of the lead frames 31. Thus assembly equipment can be of a relatively simple design.

The solenoid 51 and the ram 54 are controlled by conventional systems that need not be described herein.

Loading the lead wires 42a–c into the resuable primary lead frame 31 proceeds as follows. With the elongated member 52 in the upper position (FIG. 8) two lead frames 31 are placed end to end in the channel 55. With the latch member 57 in the position shown in FIG. 7 approximate alignment of the positioning cylinder 67 and the sleeve 41 is obtained.

The solenoid 51 (or other wire feed system) is activated to extend the wires 42 to the position shown in FIG. 6. Following that, the ram 54 is activated. During the downward motion of the elongated member 52, the two members 32 and 33 comprising the lead frame 31 engage the wires 42 and, due to the resiliency of the members 32 and 33 and the restraint on the downward motion of the wires caused by the base 50, the wires 42 are gripped by the primary lead frame. Inasmuch as the slots 65 are slightly wider than the thickness of the wires, there will be no restraint on the lifting of the wires during the subsequent upward motion of the elongated member 52.

Shortly following the receipt of the wires 42 in the lead retaining slots 35, the cutting blade 59 shears the wires 42 to the appropriate length.

Following cutting, while the cutting blade 59 completes its overtravel into the groove in the base surface, the flattening dies 63 and 64 approach each other to form the flattened portions on the ends of the lead wires 42a–c that are shown in FIG. 4.

After the flattening operation, the ram 54 retracts and the now severed lead wires are lifted out of the slots 65 during the upward motion of the elongated member 52.

Following the vertical retraction of the ram 54, a machine operator moves the latch member 57 to the position shown in phantom in FIG. 7. The two lead frames 31 are then moved toward the right and the lead frame that was previously on the right is removed from the channel. This lead frame motion is most easily achieved by inserting another lead frame 31 into the channel 55 from the left. When the right lead frame 31 is removed from the channel, the operator moves the latch member 57 back to the position shown in FIG. 7. The lead frame 31 that has just received the sets of lead wires 42a–42c now provides approximate indexing for the new lead frame that has been inserted. The wire loading cycle is now repeated. Each cycle provides a lead frame 31 with 25 sets of lead wires for the production of 25 semiconductor devices.

Referring now to FIG. 9 there is shown a portion of a strip of metallic material 71 that is used in the subsequent stages of transistor manufacture in accordance with the subject method. The strip may be fabricated from materials such as, for example, KOVAR. At spaced intervals along the strip 71 are semiconductor device chips 72 that will form the active elements of the semiconductor devices. Between the chips 72, at spaced intervals, are indexing dimples 73 that have been formed in the strip. The KOVAR strip 71 can be dimpled and have the chips 72 mounted thereon by conventional apparatus.

Referring now to FIG. 10 there is shown an apparatus 75 for welding portions of the strip 71 to the lead wires 42b. A base 76 supports two ribs 77 and 78 that define a channel that slideably retains a primary lead frame 31. Indexing for positioning the lead frame 31 is preferably similar to the indexing system depicted in FIGS. 6–8. Furthermore, it should be realized that what is shown is but a portion of the apparatus 75. Actually, 25 similar systems feed 25 strips 71, one strip for each of the lead wires 42b.

A pedestal 79 comprises one electrode of a spot welder 81 that is coupled to a second electrode 82. It will be observed that the flattened end of the lead wire 42b and the end of the strip 71 are disposed between the electrodes 79 and 82. The strip 71 is supplied from a roll 70 of the material shown in FIG. 9. A positioning member 83 cooperates with a cutter 84 that is driven by a solenoid 85 to position the strip 71 and sever a portion of the strip following the welding of that portion to the lead wire 42b. A platen 86 cooperates with a solenoid 87 and pawl 88 in a configuration similar to that depicted in FIG. 6. The pawl 88, when moving to the right (as viewed in FIG. 10) is urged against a dimple 73 and moves the strip 71 a predetermined distance (determined by the solenoid travel) to the right. The dimples 73 are spaced apart by a distance slightly less than the solenoid travel. Thus, following the solenoid return stroke the pawl 88 comes to rest just to the left (as viewed in FIG. 10) of a dimple. Consequently, very early in each stroke, the pawl encounters a dimple.

During the operation of the apparatus 75, a lead frame 31 is slideably inserted into the position depicted in FIG. 10. The solenoid 87 is activated by a conventional system to move the end of the strip 71 so that it overlaps the flattened portion of the wire 42b. Next, the welder 81 is activated to weld the end of the strip 71 and the flattened portion of the lead wire 42b. Finally, the solenoid 85 is activated by conventional apparatus and the welded portion of the strip 71 is severed from the remainder of the strip. Following the cutting operation, the primary lead frame 31 is slideably removed from the apparatus 75. Slideable removal is preferable inasmuch as any vertical motion of the lead frame 31 while near the welding electrodes 79 and 82 could damage the weld or the pellet 72 on the strip 71. Similar indexing is used to ball bond appropriate leads to the devices with conventional equipment.

Referring now to FIGS. 11-14, there is shown a resilient segmented reusable lead frame 91 with a plurality of elements 92 that are resiliently mounted with respect to each other and form a linear array. Each element 92 is adapted as hereinafter set forth to support a set of lead wires 42a-42c. The sets of wires 42a-c are transferred to the lead frame 91 following the application of flying leads to electrically couple the pellet 72 to the leads 42a and 42c. The flying leads are attached by conventional methods while the lead frames 31 are supported and indexed by methods similar to those shown above.

The frame 91 is molded of a resilient plasic and, due to the arrangement of slots 93 between the elements 92, they can be forced closer together or separated. Two generally parallel rows 94 and 95 of projecting tabs 96 on the face of each element form two groups of three lead wire retaining slots 97 on each element. The rows 94 and 95 are spaced a predetermined distance apart which is different than the separation of the metallic member 32 and 33 of the lead frame 31. The lead wire retaining slots 97 are spaced substantially identically with the lead wire retaining slots 35 in the lead frame 31. Thus, a transfer of sets of lead wires from the primary lead frame 31 to the segmented lead frame 91 as hereinafter set forth is facilitated.

A plurality of alignment pins 98 project from the frame 91 in a direction that is substantially parallel to sets of lead wires 42a-c when in the lead frame. The function of the alignment pins 98 shall hereinafter become apparent. As shown most clearly in FIG. 13, a positioning tab 99 projects from each element 92 for purposes hereinafter set forth.

The segmented lead frame 91 was depicted above with the lead wires in place to clearly point out how the wires are retained. Following is an explanation of the system by which the sets of lead wires are transferred from the primary lead frame 31 to the segmented lead frame 91.

Shown schematically in FIGS. 15 and 16 is an apparatus 101 for transferring sets of lead wires from the primary lead frame 31 to the segmented lead frame 91. First, the segmented lead frame is inserted in one member 102 of the apparatus 101. The member 102 (a portion of which is shown in FIG. 15) has a plurality of Y-shaped slots that receive the support positioning tabs 99. The angled portions of the slots aid in guiding the tabs and the straight portions grip the tabs such that they are well supported. The spacing of the Y-shaped slots is carefully chosen so that the wire retaining slots 97 are spaced substantially identically to the lead wire retaining slots 35 of the lead frame 31. The resilient coupling among the elements 92 permits the Y-shaped slots to establish accurate spacing.

After the segmented lead frame 91, without wires, is inserted in the member 102, a primary lead frame 31, with sets of lead wires that have received pellets and been ball bonded is positioned in notches 104 of members 111 as shown in FIGS. 15 and 16. The Y-shaped slots and the notches 104 in the member 102 assure that the wire retaining slots 35 and 97 are aligned. Approach of a member 112 from the rear of the carrier 31 forces the carrier, via spring loaded pads 113, into the notches 104. A ram connected to two shafts 114 moves the member 112. Thus, when the lead frame 91 is forced into the position shown in FIGS. 15 and 16, with the tabs 96 partially overlapping the members 32 and 33, the lead wires are pressed into the previously empty slots 97 in the lead frame 91, but are also retained in the slots 35.

After the lead frames are positioned as shown in FIGS. 15 and 16, two rams 115 are activated to move the carrier 31 and the pads 113 away from the lead frame 91. The member 112 remains stationary and thus the lead wires 42 remain in the slots 97. Next, the member 112 is withdrawn to remove the lead frame 31 from the notches 104. Consequently, following the aforementioned steps, the sets of lead wires are retained in the segmented lead frame 91 as illustrated in FIG. 14. The lead frame 91, with wires 42, is then removed from the notches 99.

Referring now to FIGS. 17-19 there is shown a plastic mold 105 defining a linear array of cup-shaped mold cavities 106. The mold 105 is preferably formed of plastic material with substantially the same thermal coefficient of expansion as is possessed by the segmented lead frame 91. It will be observed from FIGS. 17-19 that the cup-shaped cavities 106 are of a shape to facilitate the formation of a plastic body such as that denoted as number 22 in FIGS. 1-3. Associated with each cup shaped cavity is an alignment opening 107. The alignment pins 98 shown in FIGS. 12 and 14 are received by the alignment openings 107 during the molding process.

The encapsulation process begins by filling the cup-shaped cavities 106 with a liquid plastic encapsulant such as an epoxy. Next, the segmented lead frame 91, containing the sets of lead wires, is positioned over the plastic mold 105 as shown in FIGS. 20 and 21. When the alignment pins 98 are aligned with the alignment openings 107 and the ends of the lead wires are positioned over the cup-shaped cavities, the segmented lead frame 91 is moved in a downward direction to the position shown in FIGS. 22 and 23. With the segmented lead frame 91 and the mold 105 juxtaposed as shown in FIGS. 22 and 23, the plastic encapsulant is cured. Proper concentricity of the sets of lead wires and the cup-shaped cavities 106 is assured inasmuch as each element is coupled to its associated mold cavity 106 by a pin 98 and an opening 107, thus adjustments in the variable spacing among the elements are made automatically. The same advantage of automatic adjustment could, of course, be realized by using a rigid lead frame and a segmented, adjustable mold.

Following the cure of the encapsulant, the segmented lead frame 91 is gripped by the tabs 91 and slid in an upward direction as indicated in FIG. 24. The mold 105 retains the completed transistors.

As illustrated in FIG. 25, the completed transistors are removed from the mold 105 by gripping and pulling the leads 42 with a clamp apparatus 108 while simultaneously deforming the lower portion of each cup-shaped cavity with a solenoid and plunger 109. The solenoid 109 breaks any seal that may have formed between the mold 105 and the encapsulant thus permitting the clamp apparatus 108 to withdraw the transistors.

While the lead frames 31 and 91 and the mold 105 will eventually wear out and require replacement, it will be appreciated that material waste is substantially reduced as compared to prior art systems.

In light of the foregoing, many modifications and variations of the subject invention will be obvious to those skilled in the art. For example, devices other than transistors can be made and encapsulants other than epoxy can be used. Or it will be obvious that practice of the broad concept of fabricating semiconductor devices while supporting many lead wires in a relatively rigid lead frame and encapsulating the devices while they are supported in an adjustable lead frame that cooperates with a mold can be carried out with lead frames and molds of many different designs. It will be appreciated, therefore, that the scope of the invention is only as defined by the following claims.

What is claimed is:

1. A method for the manufacture of semiconductor devices wherein a first substantially rigid lead frame is utilized during a first manufacturing operation and a second, resiliently-connected lead frame is utilized during a second manufacturing operation, comprising:
   mounting a plurality of sets of lead wires in a rigid primary lead frame;
   simultaneously aligning all of said sets of lead wires with a first plurality of work stations by aligning said rigid primary lead frame with said work stations;
   mounting a semiconductor device on each of said sets of lead wires and providing electrical connections among said lead wires and said device;
   transferring said plurality of sets of lead wires to a segmented lead frame comprising a plurality of separate lead-receiving elements each of which receives one of said sets of lead wires and is resiliently connected with the other ones of said elements;
   independently aligning each of said lead-receiving elements with a plurality of second work stations; and
   encapsulating said semiconductor pellets and at least a portion of each of said sets of lead wires in an encapsulating material.

2. The method of claim 1 wherein said independently aligning comprises engaging first alignment means on each of said separate, lead-receiving elements with a plurality of aligning means at each of said second work stations.

3. The method of claim 2 wherein said encapsulating comprises simultaneously inserting a portion of each of said sets of lead wires into one of a plurality of cup-shaped mold cavities wherein said segmented reuseable lead frame and said mold cavities include alignment means for assuring that each of the lead wire and pellet assemblies is aligned in a predetermined relationship with one of said cup-shaped mold cavities.

* * * * *